(12) United States Patent
Oh

(10) Patent No.: US 7,808,597 B2
(45) Date of Patent: Oct. 5, 2010

(54) DISPLAY MODULE

(75) Inventor: Myong Rock Oh, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 11/997,519

(22) PCT Filed: Feb. 21, 2007

(86) PCT No.: PCT/KR2007/000888

§ 371 (c)(1),
(2), (4) Date: Jan. 31, 2008

(87) PCT Pub. No.: WO2007/102662

PCT Pub. Date: Sep. 13, 2007

(65) Prior Publication Data

US 2008/0310090 A1    Dec. 18, 2008

(30) Foreign Application Priority Data

Mar. 8, 2006    (KR) .................... 10-2006-0021717

(51) Int. Cl.
*G02F 1/1345* (2006.01)
*G02F 1/1333* (2006.01)
*H05K 1/00* (2006.01)

(52) U.S. Cl. .................... 349/149; 349/150; 349/58; 361/749

(58) Field of Classification Search ................ 349/150, 349/149, 58; 361/749, 750, 752, 755

See application file for complete search history.

(56) References Cited

U.S. PATENT DOCUMENTS

| | | | |
|---|---|---|---|
| 6,211,936 B1 * | 4/2001 | Nakamura | 349/152 |
| 6,703,702 B2 * | 3/2004 | Inoue et al. | 257/684 |
| 2003/0117543 A1 | 6/2003 | Chang | |
| 2005/0151918 A1 | 7/2005 | Park et al. | |
| 2005/0185127 A1 | 8/2005 | Fujiyama et al. | |

* cited by examiner

*Primary Examiner*—Mike Qi
(74) *Attorney, Agent, or Firm*—Birch, Stewart, Kolasch & Brich, LLP

(57) ABSTRACT

Provided is a display module. The display module includes a panel, a printed circuit board (PCB), a flexible printed circuit board (FPCB), and a support member. The panel displays images. The PCB supplies driving signals to the panel. The FPCB electrically connects the PCB to the panel. The support member is formed on the FPCB.

20 Claims, 4 Drawing Sheets

DISPLAY MODULE

CROSS-REFERENCE TO RELATED APPLICATION

This application is the U.S. national stage application of International Patent Application No. PCT/KR2007/000888, filed Feb. 21, 2007, the disclosure of which is hereby incorporated by reference in its entirety.

TECHNICAL FIELD

Embodiments relate to a display module.

BACKGROUND ART

A flat panel display (FPD) module is used in mobile devices as well as large-sized display devices.

The FPD module includes a panel displaying images, a printed circuit board (PCB) driving the panel, and a flexible printed circuit board (FPCB) electrically connecting the panel to the PCB.

Various flat display devices are used as the panel. Especially, liquid crystal panels are used in small-sized mobile devices.

Meanwhile, the PCB may be in a different plane from that of the panel. For example, the PCB may be located behind the panel. Flexible member such as the FPCB is appropriate for connecting the panel to the PCB.

The FPCB has a restoring force since the FPCB is flexible. When the FPCB is folded, it tends to be unfolded by the restoring force.

Therefore, when the PCB is located behind the panel, the gap between the panel and the PCB is generated by the restoring force of the FPCB.

DISCLOSURE OF INVENTION

Technical Problem

Embodiments of the present invention provide a display module prevent a panel from coming off a PCB when the panel is electrically connected to the PCB using a FPCB.

Technical Solution

An embodiment of the present invention provides a display module comprising a panel displaying images, a printed circuit board (PCB) supplying driving signals to the panel, a flexible printed circuit board (FPCB) electrically connecting the PCB to the panel, and a support member formed on the FPCB.

An embodiment of the present invention provides a display module comprising a panel displaying images, a printed circuit board (PCB) supplying driving signals to the panel, and a flexible printed circuit board (FPCB) electrically connecting the PCB to the panel, wherein the FPCB includes a base layer, a first copper foil pattern and a first cover layer formed on a first surface of the base layer, and a second copper foil pattern and a second cover layer formed on a second surface of the base layer, and the first cover layer formed on an outer surface of the folded FPCB is partially removed.

An embodiment of the present invention provides a device comprising a first electric device, a printed circuit board (PCB) supplying driving signals to the first electric device, a flexible printed circuit board (FPCB) electrically connecting the PCB to the first electric device, and a support member formed on the FPCB.

Advantageous Effects

Embodiments prevent a panel from coming off a PCB caused by a FPCB.

MODE FOR THE INVENTION

Hereinafter, embodiments will now be more fully described with reference to the accompanying drawing.

Embodiment

Figure 1:
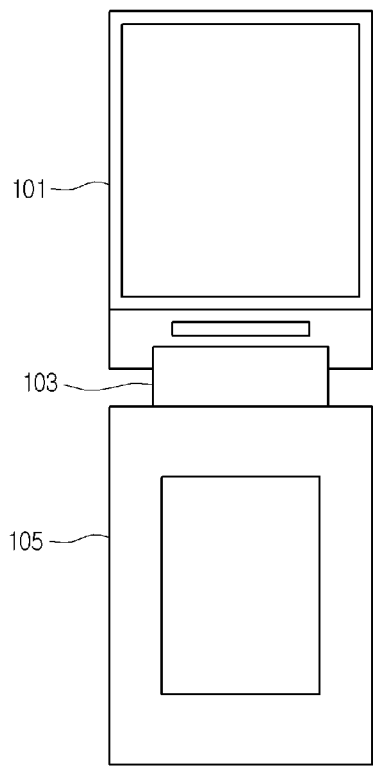
FIGS. 1 and 2 are views illustrating the configuration of a display module.
Figure 2:
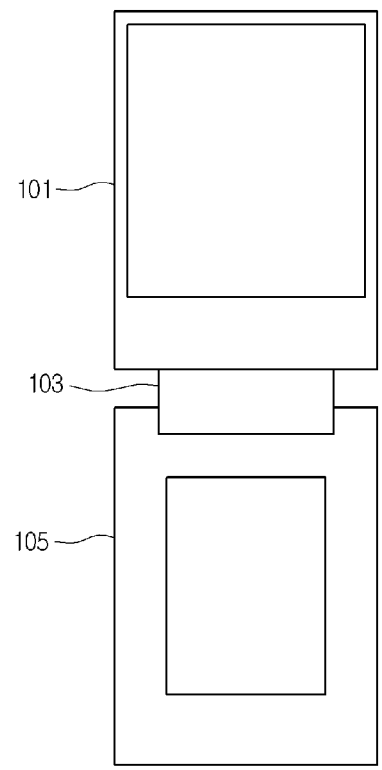

FIGS. 1 and 2 are views illustrating the configuration of a display module.

FIG. 1 is a front view of the display module, and FIG. 2 is a rear view of the display view.

Referring to FIG. 1 and 2, the display module includes a panel 101, a flexible printed circuit board (FPCB) 103, and a printed circuit board (PCB) 105.

The panel 101 displays images. The PCB 105 supplies driving signals to the panel 101. The PCB 105 is electrically connected to the panel 101 using the FPCB 103.

The display module can be folded at the FPCB 103 so as to be assembled. When the display module is folded, the FPCB 103 has a restoring force. The panel 101 comes off the PCB 105 since the restoring force unfolds the display module.

In order to prevent the panel 101 from coming off the PCB 105, a portion of a cover layer included in the FPCB 103 is removed as illustrated in FIGS. 3 through 6.

Figure 3:
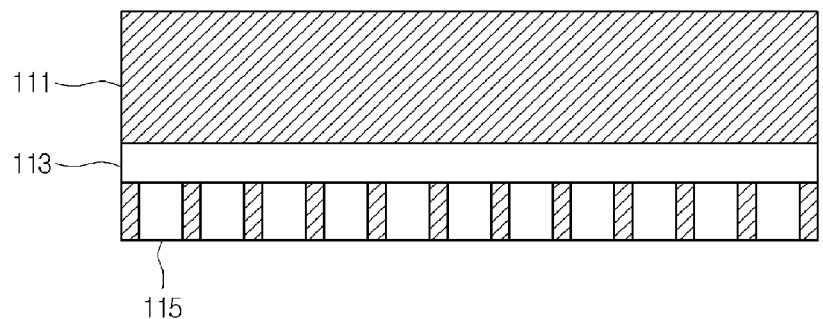
FIGS. 3 through 6 are views illustrating the shape of a FPCB applied to a display module.
Figure 4:
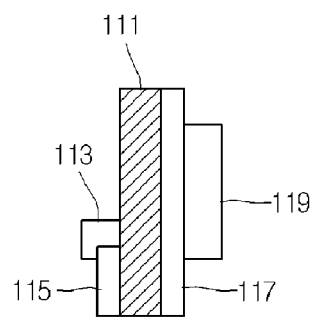
Figure 5:
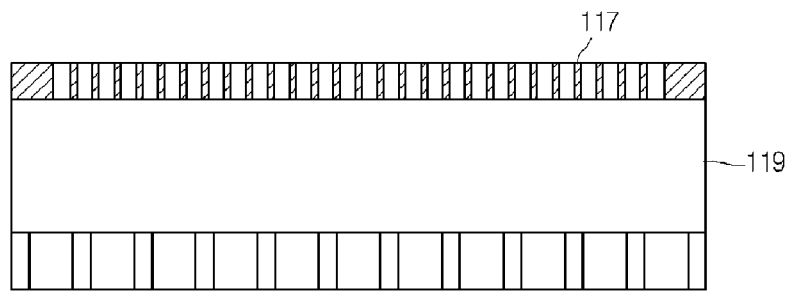

FIGS. 3 through 6 are views illustrating the shape of the FPCB 103 applied to the display module. FIG. 3 is a front view of the FPCB 103. FIG. 4 is a sectional view of the FPCB 103. FIG. 5 is a rear view of the FPCB 103.

The FPCB 103 includes a base layer 111, a first cover layer 113, a first copper foil pattern 115, a second copper foil pattern 117, and a second cover layer 119.

The first copper foil pattern 115 is electrically connected to the PCB 105, and the second copper foil pattern 117 is electrically connected to the panel 101. The first copper foil pattern 115 is electrically connected to the second copper foil pattern 117 through a via hole (not shown) formed in the base layer 111.

Figure 6:
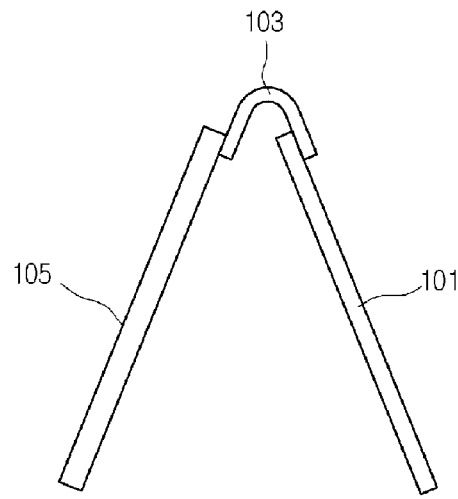

Referring to FIG. 6, the first copper foil pattern 115 formed on the outer surface of the folded FPCB 103 contacts the PCB 105. The second copper foil pattern 117 formed on the inner surface of the folded FPCB 103 contacts the panel 101.

Although not shown, the first copper foil pattern 115 formed on the outer surface of the folded FPCB 103 may contact the panel 101. The second thin copper pattern 117 formed on the inner surface of the folded FPCB 103 may contact the PCB 105.

Meanwhile, in order to reduce the restoring force of the FPCB 103, a portion of the first cover layer 113 is removed.

That is, the thickness of the FPCB 103 is minimized by removing a portion of the first cover layer 113 formed on the outer surface of the folded FPCB 103. Hence, the restoring force of the FPCB 103 is reduced.

In other words, the first cover layer 113 formed on the outer surface of the folded FPCB 103 can be considered as a tensile surface, and the second cover layer 119 formed on the inner surface of the folded FPCB 103 can be considered as a shrinkage surface. The restoring force of the FPCB 103 is reduced by removing a portion of the tensile surface.

Another Embodiment

Figure 7:
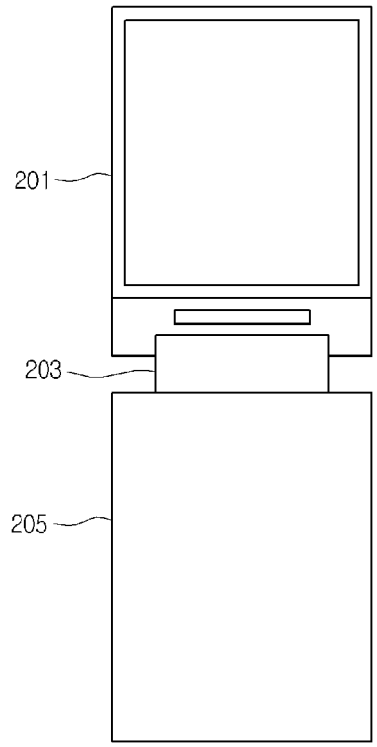
FIGS. 7 through 9 are views illustrating the configuration of a display module according to an embodiment.
Figure 8:
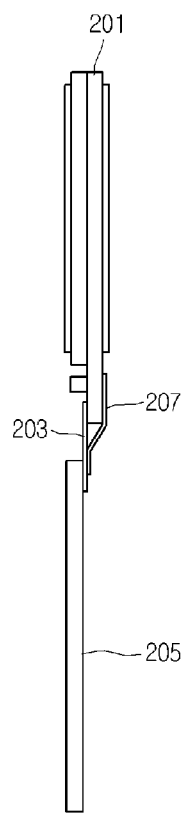
Figure 9:
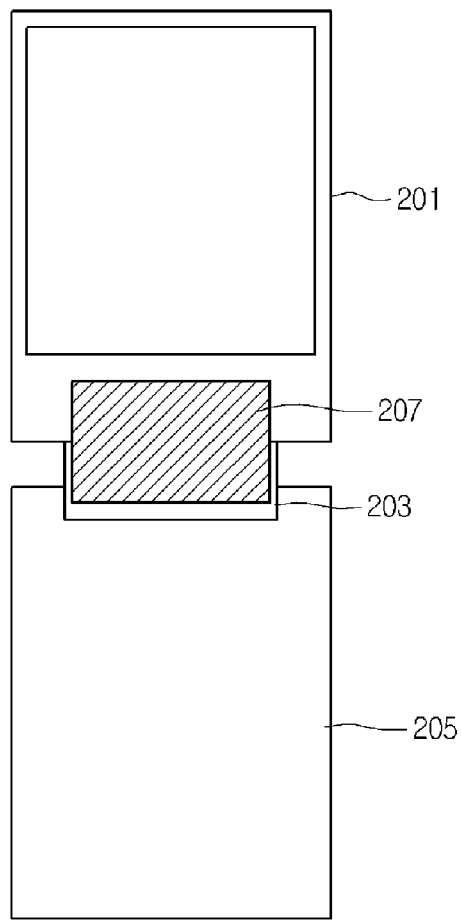
Figure 10:
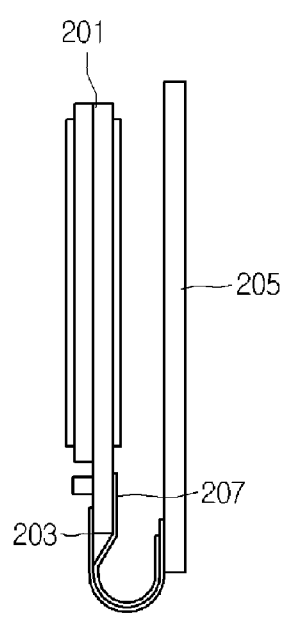
FIG. 10 is a conceptional view illustrating a display module which is folded according to an embodiment.

FIGS. 7 through 9 are views illustrating the configuration of a display module according to an embodiment. FIG. 7 is a front view of the display module. FIG. 8 is a side view of the display module. FIG. 9 is a rear view of the display module. FIG. 10 is a conceptional view illustrating the display module which is assembled according to an embodiment.

Referring to FIGS. 7 through 10, the display module according to an embodiment includes a panel 201, a FPCB 203, a PCB 205, and a support member 207.

The panel 201 displays images. The PCB 205 supplies driving signals to the panel 201. The PCB 205 is electrically connected to the panel 201 using the FPCB 203. The support member 207 is formed on the FPCB 203.

The FPCB 203 may have the same configuration as illustrated in FIG. 4. The support member 207 may be formed on the second cover layer 119.

In other words, the outer surface of the folded FPCB 203 can be considered as a tensile surface, and the inner surface of the folded FPCB 203 can be considered as a shrinkage surface. The support member 207 may be formed on the shrinkage surface. In addition, when the support member 207 is formed on even the tensile surface, the support member 207 can reduce the restoring force of the FPCB 203.

The support member 207 is formed of a material having no restoring force when the material is deformed. The support member 207 may be a metal tape formed of a thin metal layer and an adhesive layer.

The support member 207 may be an adhesive tape including aluminum-based or copper-based light metals. For example, the support member 207 may be an adhesive metal tape which is made by making an aluminum-based or a copper-based light metal into a sheet, and then applying an adhesive to the light metal sheet.

Although the FPCB 203 has the restoring force, the support member 207 has no restoring force. Hence, the restoring force of the FPCB 203 can be restrained.

Referring to FIG. 10, the support member 207 is attached to the panel 201 and the FPCB 203.

When the display module according to an embodiment is folded, the panel 201 and the PCB 205 are rotated around the FPCB 203. The support member 207 is also folded.

Although FIG. 10 is a conceptional view illustrating the display module which is folded, the panel 201 closely contacts the PCB 205.

The folded FPCB 203 has a restoring force. The support member 207 restrains the restoring force of the FPCB 203. The restoring force can be adjusted by controlling the material and thickness of the support member 207.

That is, the support member 207 is selected considering a restoring force of the FPCB 203, and thus a larger restraining force can be applied than the restoring force.

Hence, the panel 201 does not come off the PCB 205, and the panel 201 and the PCB 205 remain folded.

As a result, the support member 207 is attached to a folded portion of the FPCB 203 to restrain the restoring force of the FPCB 203, and thus to prevent the panel 201 from coming off the PCB 205 from the start.

The support member 207 can be attached to various portions. For example, the support member 207 may be attached to the FPCB 203, with the support member 207 being attached to a portion of the panel 201. The support member 207 may be attached to the FPCB 203, with the support member 207 being attached to a portion of the PCB 205. In addition, the support member 207 may be attached to the FPCB 203, with the support member 207 being attached to portions of the panel 201 and the PCB 205.

The PCB 205 supplying driving signals to the panel 201 may be a hard PCB or a FPCB. In addition, the PCB 205 may have a circuit formed around the edge of the PCB 205 and no circuit in a portion of the inside of the PCB 205. The PCB 205 may have various shapes.

While exemplary electric device connected to the FPCB has been particularly shown and described with reference to the panel, it will be understood by one of ordinary skill in the art that various electric devices such as PCBs and semiconductor chips may be connected to the FPCB without departing from the spirit and scope described through the embodiments.

Industrial Applicability

Embodiments may be applied to electric devices connected using a FPCB.

The invention claimed is:

1. A display module comprising:
 a panel displaying images;
 a printed circuit board supplying driving signals to the panel;
 a flexible printed circuit board electrically connecting the printed circuit board to the panel, wherein when the flexible printed circuit board is folded, an outer surface of the folded flexible printed circuit board is attached to one of the panel and the printed circuit board, and an inner surface of the folded flexible printed circuit board is attached to the other of the panel and the printed circuit board; and
 a support member formed on the flexible printed circuit board.

2. The display module according to claim 1, wherein the support member comprises a first portion attached to the panel and a second portion attached to the flexible printed circuit board.

3. The display module according to claim 1, wherein the support member comprises a first portion attached to the printed circuit board and a second portion attached to the flexible printed circuit board.

4. The display module according to claim 1, wherein the support member comprises a first portion attached to the printed circuit board, a second portion attached to the flexible printed circuit board, and a third portion attached to the panel.

5. The display module according to claim 1, wherein the support member is attached to the inner surface of the folded flexible printed circuit board.

6. The display module according to claim 1, wherein the support member is attached to the outer surface of the folded flexible printed circuit board.

7. The display module according to claim 1, wherein the support member has no restoring force when the support member is folded.

8. The display module according to claim 1, wherein the support member is formed of a thin metal layer and an adhesive layer.

9. The display module according to claim 1, wherein the support member is an adhesive tape including a metal.

10. The display module according to claim 1, wherein the flexible printed circuit board comprises:
- a base layer;
- a first copper foil pattern and a first cover layer that are formed on a first surface of the base layer; and
- a second copper foil pattern and a second cover layer that are formed on a second surface of the base layer, wherein the first cover layer formed on an outer surface of the folded flexible printed circuit board is partially removed.

11. A display module comprising:
- a panel displaying images;
- a printed circuit board supplying driving signals to the panel; and
- a flexible printed circuit board electrically connecting the printed circuit board to the panel, wherein the flexible printed circuit board includes a base layer, a first copper foil pattern and a first cover layer that are formed on a first surface of the base layer, and a second copper foil pattern and a second cover layer that are formed on a second surface of the base layer, and the first cover layer formed on an outer surface of the folded flexible printed circuit board is partially removed.

12. The display module according to claim 11, wherein the flexible printed circuit board comprises a support member, a first portion of the support member is attached to the panel, and a second portion of the support member is attached to the second cover layer of the flexible printed circuit board.

13. The display module according to claim 11, wherein the flexible printed circuit board comprises a support member, a first portion of the support member is attached to the flexible printed circuit board, and a second portion of the support member is attached to the second cover layer of the flexible printed circuit board.

14. The display module according to claim 11, wherein the flexible printed circuit board comprises a support member, and the support member has no restoring force when the support member is folded.

15. The display module according to claim 11, wherein the flexible printed circuit board comprises a support member, and the support member is formed of a thin metal layer and an adhesive layer.

16. The display module according to claim 11, wherein the flexible printed circuit board comprises a support member, and the support member is an adhesive tape including a metal.

17. A device comprising:
- a first electric device;
- a printed circuit board supplying driving signals to the first electric device;
- a flexible printed circuit board electrically connecting the printed circuit board to the first electric device, wherein when the flexible printed circuit board is folded, an outer surface of the folded flexible printed circuit board is attached to one of the first electric device and the printed circuit board, and an inner surface of the folded flexible printed circuit board is attached to the other of the first electric device and the printed circuit board; and
- a support member formed on the flexible printed circuit board.

18. The device according to claim 17, wherein the support member is an adhesive tape including a metal.

19. The device according to claim 17, wherein the support member is attached to an inner surface of the folded flexible printed circuit board.

20. The device according to claim 17, wherein the support member restrains the restoring force of the flexible printed circuit board.

* * * * *